(12) United States Patent
Markle et al.

(10) Patent No.: US 6,621,412 B1
(45) Date of Patent: Sep. 16, 2003

(54) TROUBLESHOOTING METHOD INVOLVING IMAGE-BASED FAULT DETECTION AND CLASSIFICATION (FDC) AND TROUBLESHOOTING GUIDE (TSG), AND SYSTEMS EMBODYING THE METHOD

(75) Inventors: Richard J. Markle, Austin, TX (US); Elizabeth Weaver, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 206 days.

(21) Appl. No.: 09/782,840

(22) Filed: Feb. 14, 2001

(51) Int. Cl.[7] .............................................. G08B 23/00
(52) U.S. Cl. ...................... 340/517; 340/691.6; 700/95; 700/110
(58) Field of Search ........................... 700/95, 108, 109, 700/110; 438/14; 340/691.6, 691.1, 679, 517, 521

(56) References Cited

U.S. PATENT DOCUMENTS

| | | | | |
|---|---|---|---|---|
| 4,873,623 A | * | 10/1989 | Lane et al. | 700/83 |
| 5,761,064 A | * | 6/1998 | La et al. | 700/110 |
| 5,801,965 A | * | 9/1998 | Takagi et al. | 700/110 X |
| 5,913,066 A | * | 6/1999 | Benzenberg et al. | 717/174 |
| 6,128,403 A | * | 10/2000 | Ozaki | 700/95 X |
| 2002/0006675 A1 | * | 1/2002 | Shigaraki | 438/4 |

\* cited by examiner

*Primary Examiner*—Thomas Mullen
(74) *Attorney, Agent, or Firm*—Williams, Morgan & Amerson

(57) ABSTRACT

Several different embodiments of a troubleshooting method are described. In one embodiment, an alarm data image is provided (e.g., to a user). The alarm data image may be displayed upon on a display screen visible by the user. The alarm data image includes an image indicative of a problem (e.g., an abnormal condition or faulty state of a processing or metrology tool). Information indicative of a class in which the problem resides is used to access a corresponding portion of a troubleshooting guide (TSG). The corresponding portion of the TSG includes one or more symptom images, wherein each symptom image includes an image indicative of a symptom of the class in which the problem resides. Each symptom image has a corresponding corrective action. A selected one of the symptom images is selected (e.g., by the user). Where the selecting is performed by the user, the user may select one of the symptom images the user believes most closely resembles the alarm data image. The corrective action corresponding to the selected one of the at least one symptom image is provided (e.g., to the user). The corrective action may be displayed upon on the display screen. The corrective action may be accomplished (e.g., by the user) to solve the problem. The alarm data image and/or the symptom images may be, for example, two-dimensional (2D) charts or graphs, three-dimensional (3D) charts or graphs, or images or pictures. Several embodiments of a fabrication system are described, each incorporating the troubleshooting method.

22 Claims, 7 Drawing Sheets

TROUBLESHOOTING METHOD INVOLVING IMAGE-BASED FAULT DETECTION AND CLASSIFICATION (FDC) AND TROUBLESHOOTING GUIDE (TSG), AND SYSTEMS EMBODYING THE METHOD

BACKGROUND OF THE INVENTION

1. Field of the Invention

This invention relates generally to fabrication systems, and, more particularly, to semiconductor wafer fabrication systems including one or more processing tools through which semiconductor wafers are processed in order to form integrated circuits thereon, wherein when a problem is detected with a processing tool a troubleshooting procedure is initiated to solve the problem.

2. Description of the Related Art

Integrated circuits are typically formed by processing one or more semiconductor wafers as a "lot" through a series of wafer fabrication tools (i.e., "processing tools"). Each processing tool typically performs a single wafer fabrication operation upon the semiconductor wafers of a given lot. For example, a particular processing tool may perform a layering operation, a patterning operation, a doping operation, or a heat treatment upon the semiconductor wafers. A layering operation typically adds a layer of a desired material to an exposed surface of the semiconductor wafers. A patterning operation typically contributes to the removal of selected portions of one or more layers formed by layering. A doping operation typically places dopant atoms upon and within exposed surfaces of the semiconductor wafers, thereby producing p-n junctions required for semiconductor operation. A heat treatment typically heats the semiconductor wafers to achieve specific results (e.g., dopant drive-in or annealing).

Each processing tool typically performs a wafer fabrication operation according to a predefined procedure (i.e., a predetermined set of steps or "recipe"). For example, a given chemical vapor deposition (CVD) processing tool may carry out a layering operation within a chamber according to a recipe which specifies temperatures and pressures within the chamber as a function of time, as well as the types and flow rates of gases introduced into the chamber.

Characteristics of processed wafers, such as characteristics of key integrated circuit structures formed during wafer fabrication, are typically measured to ensure the characteristics remain within acceptable ranges. In order to detect manufacturing problems as quickly as possible, such measurements are typically performed as soon as possible following critical processing steps. For example, special test structures may be formed on "test" wafers processed along with "product" wafers, or within test areas of the product wafers, and the characteristics of the special test structures may be measured. One common technique for tracking and analyzing manufacturing process variation is called statistical process control (SPC). SPC is typically used to gauge the stability of a manufacturing process over time via charted SPC data (i.e., SPC control charts) which document historical process performance.

When SPC data regarding one or more wafers processed through a given tool indicates a characteristic of the wafers affected by the processing tool has departed from an acceptable range established for the characteristic, an alarm condition may be signaled, and the processing tool may be shut down. In such a situation, a troubleshooting procedure is initiated, the object of which is to clear the alarm condition (i.e., solve the problem) and to return the processing tool to service as quickly as possible.

FIG. 1 is a diagram depicting a typical troubleshooting procedure initiated when a problem with a processing tool is detected (i.e., when a processing tool is subject to an alarm condition). The processing tool may be, for example, a furnace, and the alarm condition may be caused by the fact that a total number of particulate contaminants upon surfaces of wafers processed through the furnace exceeds an SPC upper control limit established for the furnace. When the problem is detected, the processing tool may be shut down due to the alarm condition. Alarm data 100 is presented to a user 102 (e.g., an operator or engineer). In FIG. 1, alarm data 100 is an SPC chart showing that that the total number of particulate contaminants upon surfaces of wafers processed through the furnace exceeds the SPC upper control limit.

Alarm data 100 defines the alarm condition (i.e., the problem with the processing tool). In response to alarm data 100, user 102 may elect to employ a troubleshooting guide (TSG). A TSG represents a systematic method for clearing the alarm condition (i.e., solving the problem) and returning the processing tool to service.

Two of several known types of troubleshooting guides (TSGs) are shown in FIG. 1. A first type of TSG 104 is a textual document divided into sections. Each section may be, for example, directed to a different type or "class" of problem (i.e., "fault class" or "problem class"). Each problem class may be directed to a particular type of processing tool and/or a particular application of the particular type of processing tool. Each section of TSG 104 may be divided into subsections, and each subsection may include words describing one or more symptoms of the problem class. A given subsection may also include a probable cause and a corrective action for one or more of the described symptoms, wherein a corrective action is an action which must be accomplished to solve the problem (i.e., to clear the alarm condition). Where the given subsection does not include a probable cause and a corrective action for a described symptom, the described symptom is typically covered in another subsection, and the given section typically directs user 102 to the other subsection.

When employing textual document TSG 104, user 102 must select a section dealing with the problem class indicated by alarm data 100, then read through the subsections of the selected section until a symptom which matches the alarm condition is found. User 102 must then continue to read through the subsections as directed until a probable cause and corrective action corresponding to the symptom are found, then accomplish the corrective action.

A second type of TSG 106 is a flow diagram or flow chart having a single entry or "start" point and multiple steps along multiple paths between the start point and one or more end points. Each end point includes a probable cause for a symptom and a corresponding corrective action which must be accomplished to solve the problem. A path from the start point to a given one of the end points may correspond to a particular symptom. Decision steps of the flow chart are used switch a flow of troubleshooting activity from one path to another. When employing flow chart TSG 106, user 102 must establish a path from the start point to one of the end points, accomplish all required actions along the path, then accomplish the corrective action stated in the end point.

Another known type of TSG is a table having multiple entries. Each entry of the table may include, for example, words describing a symptom, a probable cause for the symptom, and a corrective action which must be accomplished to solve the problem (i.e., clear the alarm condition).

Such a tabular TSG may be divided into sections, and each section may be directed to a different problem class as described above. When employing such a tabular TSG, user 102 must select a section of the tabular TSG dealing with the problem class indicated by alarm data 100, read through the symptoms of the table entries until a symptom which matches the alarm condition is found, then take the corrective action associated with the symptom.

It is noted that with all the known types of TSGs described above, the amount of time required to locate a corrective action corresponding to a symptom (i.e., a problem) generally depends on the problem class indicated by alarm data 100 and the length and construction of the TSG.

Alternately, user 102 may elect to use an ad hoc approach 108 to solve the problem as indicated in FIG. 1. For example, faced with the particulate contaminant problem described above, user 102 may elect to clean (or direct the cleaning of) interior surfaces of the furnace in an effort to reduce a number of particulates clinging to interior surfaces of the furnace. Such particulates tend to end up on surfaces of wafers processed through the furnace, contaminating the wafers.

It is noted that reading through symptoms described in a textual document TSG, or establishing a path through a flow chart TSG, can take a long time and can be rather tedious. In view of the objectionable nature of the known types of TSGs described above, many users are tempted to first try ad hoc approach 108. It is noted, however, that ad hoc approach 108 is undesirable as the success of ad hoc approach 108 is greatly dependent upon the knowledge and experience of user 102. An example of ad hoc approach 108 is best described as a "process-of-elimination" approach. In the process-of-elimination approach, hardware parts of a tool which may be causing a particular problem are replaced one at a time " . . . until the problem is solved." While this process-of-elimination approach may eventually "solve" the problem, many working parts may have been unnecessarily replaced along the way, and far more time than necessary may have been spent in troubleshooting the problem and returning the processing tool to service. In sum, the indeterminate nature of ad hoc approach 108 usually leads to both inefficient use of time and/or resources and increased processing tool down time.

The present invention is directed to a method that may solve, or at least reduce, some or all of the aforementioned problems, and systems incorporating the method.

SUMMARY OF THE INVENTION

Several different embodiments of a troubleshooting method are described. In one embodiment of the troubleshooting method, an alarm data image is provided (e.g., to a user). For example, the alarm data image may be displayed upon on a display screen visible by the user. The alarm data image includes an image indicative of a problem (e.g., an abnormal condition or faulty state of a processing or metrology tool). Information indicative of a class in which the problem resides is used to access a corresponding portion of a troubleshooting guide (TSG). The corresponding portion of the TSG includes one or more symptom images, wherein each symptom image includes an image indicative of a symptom of the class in which the problem resides. Each symptom image has a corresponding corrective action. A selected one of the symptom images is selected (e.g., by the user). For example, where the selecting is performed by the user, the user may select one of the symptom images the user believes most closely resembles the alarm data image. The corrective action corresponding to the selected one of the at least one symptom image is provided (e.g., to the user). For example, the corrective action may be displayed upon on the display screen for the user to see. The corrective action may be accomplished (e.g., by the user) to solve the problem.

The alarm data image may be, for example, a two-dimensional (2D) chart or graph, a three-dimensional (3D) chart or graph, or an image or picture. When the alarm data image is a 2D chart or graph, each symptom image in the corresponding portion of the TSG may be a 2D chart or graph. Similarly, when the alarm data image is a 3D chart or graph, the symptom images may be 3D charts or graphs, and when the alarm data image is an image or picture, the symptom images may be images or pictures.

For example, a semiconductor wafer fabrication system may include multiple processing tools. Integrated circuits maybe formed upon semiconductor wafers by processing the semiconductor wafers through the processing tools. In this situation, the alarm data image may include, for example, a two-dimensional (2D) statistical process control (SPC) chart of data regarding a measured characteristic of at least one semiconductor wafer processed through a particular processing tool versus time. The measured characteristic is affected by the particular processing tool. The 2D SPC chart may, for example, indicate the measured characteristic has departed an acceptable range established for the particular processing tool. Each symptom image in the corresponding portion of the TSG may include a 2D SPC chart (e.g., generated from historical data) indicating a different way in which the measured characteristic may depart the acceptable range established for the particular processing tool. The selecting of the selected symptom image may involve selecting the symptom image most closely resembling the alarm data image.

Alternately, the alarm data image may be a 3D chart or graph, and the symptom images may be 3D charts or graphs. Further, the alarm data image may be an image or picture of a condition existing on or within at least one of the semiconductor wafers, and the symptom images may be images or pictures of physical conditions one or more components of the processing tool.

The information indicative of the class in which the problem resides may include, for example, a type of the particular processing tool. The information indicative of the class in which the problem resides may also include an application for which the particular processing tool is being used.

The alarm data image and one or more of the symptom images of the corresponding portion of the TSG may be displayed upon the display screen simultaneously by displaying the alarm data image and the one or more symptom images within different portions of the display screen.

Within the TSG, each symptom image may have a corresponding probable cause in addition to the corresponding corrective action. Following the selecting of the selected symptom image, both the probable cause and the corrective action corresponding to the selected symptom image may be provided (e.g., to the user). For example, both the probable cause and the corrective action corresponding to the selected symptom image may be displayed the upon the display screen (e.g., simultaneously by displaying the probable cause and the corrective action within different portions of the display screen).

A user may select the selected symptom image by moving a pointing device (e.g., a mouse) until an arrow displayed upon the display screen, and representing a positional state of the pointing device, is displayed over the selected symptom image, and activating an electrical switch (e.g., a button of the mouse).

For example, the TSG may be a link-based "hypertext" (or "hypermedia") database in which objects, such as text and graphics, are "linked" to one another. When a displayed first object having a link to a second object is selected, the link is followed and the second object is displayed. The popular World Wide Web is a system of Internet servers that support documents formatted in the hypertext markup language (HTML), wherein HTML supports links between documents, graphics, audio, and video files. Within the TSG, symptom images may be linked to corresponding probable cause and/or corrective actions. When the symptom images are displayed, and one of the symptom images is selected, the link between the selected symptom image and the corresponding probable cause and/or corrective action may be followed, and the corresponding probable cause and/or corrective action may be displayed.

Several different embodiments of a fabrication system are described, each of which incorporates an embodiment of the troubleshooting method. In one embodiment, the fabrication system includes a processing tool, a fault detection engine, a terminal, and a troubleshooting guide (TSG) server. The processing tool acts upon one or more work pieces (e.g., semiconductor wafers) processed through the processing tool, and produces processing tool data during operation. The processing tool data indicates whether the processing tool is operating in a normal state or a faulty state. The processing tool operates in the faulty state only when there is a problem with the processing tool.

The fault detection engine receives the processing tool data and uses the processing tool data to determine whether the processing tool is operating in the normal state or the faulty state. When the processing tool is operating in the faulty state, the fault detection engine provides alarm data to the terminal, wherein the alarm data is indicative of the problem with the processing tool.

The terminal is in communication with the fault detection engine and includes a display screen. The terminal responds to the alarm data from the fault detection engine by displaying an alarm data image upon the display screen, wherein the alarm data image includes an image indicative of the problem with the processing tool.

The TSG server is in communication with the fault detection engine and the terminal. When the processing tool is operating in the faulty state, the TSG server receives information indicative of a class in which the problem with the processing tool resides. The TSG server includes a TSG, and the TSG includes a portion directed to the class in which the problem with the processing tool resides. The portion of the TSG includes one or more symptom images, wherein each symptom image includes an image indicative of a symptom of a problem with the processing tool. The TSG server responds to the information by using the information to access the portion of the TSG and providing TSG data to the terminal, wherein the TSG data conveys the at least one symptom image.

The alarm data provided to the terminal by the fault detection engine may convey the alarm data image. Alternately, the terminal may be configured to generate the alarm data image from the alarm data.

The terminal may be configured to respond to the TSG data from the TSG server by displaying the symptom images conveyed by the TSG data upon the display screen. For example, the terminal may display the alarm data image and the symptom images conveyed by the TSG data within different portions of the display screen such that the alarm data image and the symptom images are displayed upon the display screen simultaneously. Alternately, where the TSG data conveys multiple symptom images, the terminal may display the alarm data image a first portion of the display screen and a portion of the symptom images within a second portion of the display screen. The terminal may display different portions of the symptom images within the second portion of the display screen at different times such that all of the symptom images are eventually displayed upon the display screen.

Within the TSG, each of the symptom images may have a corresponding probable cause and/or corrective action as described above. The TSG server may be adapted to receive selection data indicative of a selected one of the at least one symptom image. The TSG server may respond to the selection data by providing probable cause/corrective action data to the terminal, wherein the probable cause/corrective action data conveys the probable cause and/or the corrective action corresponding to the selected symptom image. The terminal may respond to the probable cause/corrective action data from the TSG server by displaying the probable cause and/or the corrective action upon the display screen.

The fabrication system may be, for example, a semiconductor wafer fabrication system. In this situation, the processing tool may be a deposition tool for depositing a layer of a desired material upon a surface of a semiconductor wafer, a photolithography tool for patterning at least one layer of a photoresist material, an etch tool for patterning at least one layer of a desired material formed upon a surface of a semiconductor wafer, an implant tool for positioning dopant atoms upon or within a surface of a semiconductor wafer, or a furnace for heating a semiconductor wafer.

Within the TSG, each corrective action may include one or more required activities, and the TSG server may be adapted to receive selection data indicative of a selected required activity involving the processing tool. The TSG server may respond to the selection data by sending one or more control signals to the processing tool, wherein the one or more control signals causes the processing tool to accomplish the required activity. Alternately, the fabrication system may include a manufacturing execution system (MES) host in communication with the TSG server and the processing tool. The TSG server may be adapted to respond to the selection data by providing a signal to the MES host. The MES host may respond to the signal by proving the one or more control signals to the processing tool, wherein the one or more control signals causes the processing tool to accomplish the required activity.

When the processing tool is operating in the faulty state, the fault detection engine may be configured to provide a shutdown command to the processing tool. Alternately, the fabrication system may include the MES host described above, and the MES host may be in communication with the fault detection engine. When the processing tool is operating in the faulty state, the fault detection engine may be configured to provide an alarm signal to the MES host. The MES host may respond to the alarm signal by providing the shutdown command to the processing tool.

A semiconductor wafer fabrication system is described including a processing tool, a metrology tool, a fault detection engine, and the terminal and TSG server described above. The semiconductor wafer fabrication system may also include the MES host described above. The processing tool may be, for example, a deposition tool for depositing a layer of a desired material upon a surface of at least one semiconductor wafer, a photolithography tool for patterning at least one layer of a photoresist material, an etch tool for patterning at least one layer of a desired material formed upon a surface of at least one semiconductor wafer, an implant tool for positioning dopant atoms upon or within a surface of at least one semiconductor wafer, or a furnace for heating at least one semiconductor wafer.

The metrology tool is used to measure characteristics of semiconductor wafers previously processed through the processing tool. The metrology tool produces metrology data regarding the processing tool, wherein the metrology data indicates whether the processing tool is operating in a normal state or a faulty state. The processing tool operates in the faulty state only when there is a problem with the processing tool. The metrology tool may also produce metrology tool data during operation, wherein the metrology tool data indicates whether the metrology tool is operating in a normal state or a faulty state. The metrology tool operates in the faulty state only when there is a problem with the metrology tool.

The fault detection engine receives the metrology data and/or the metrology tool data. The fault detection engine uses the metrology data to determine whether the processing tool is operating in the normal state or the faulty state. The fault detection engine uses the metrology tool data to determine whether the metrology tool is operating in the normal state or the faulty state. When the processing tool or the metrology tool is operating in the faulty state, the fault detection engine provides alarm data to the terminal, wherein the alarm data is indicative of the problem with the "problematic" tool (i.e., the processing tool or the metrology tool).

The terminal is in communication with the fault detection engine and includes a display screen. The terminal responds to the alarm data from the fault detection engine by displaying an alarm data image upon the display screen, wherein the alarm data image includes an image indicative of the problem with the problematic tool.

The TSG server is in communication with the fault detection engine and the terminal. When the processing tool or the metrology tool is operating in the faulty state, the TSG server receives information indicative of a class in which the problem with the problematic tool resides. The TSG server includes a TSG, and the TSG includes a portion directed to the class in which the problem with the problematic tool resides. The portion of the TSG includes one or more symptom images, wherein each symptom image includes an image indicative of a symptom of a problem with the problematic tool. The TSG server responds to the information by using the information to access the portion of the TSG and providing TSG data to the terminal, wherein the TSG data conveys the at least one symptom image.

The alarm data provided to the terminal by the fault detection engine may convey the alarm data image. Alternately, the terminal may be configured to generate the alarm data image from the alarm data.

BRIEF DESCRIPTION OF THE DRAWINGS

The invention may be understood by reference to the following description taken in conjunction with the accompanying drawings, in which like reference numerals identify similar elements, and in which.

Figure 1:
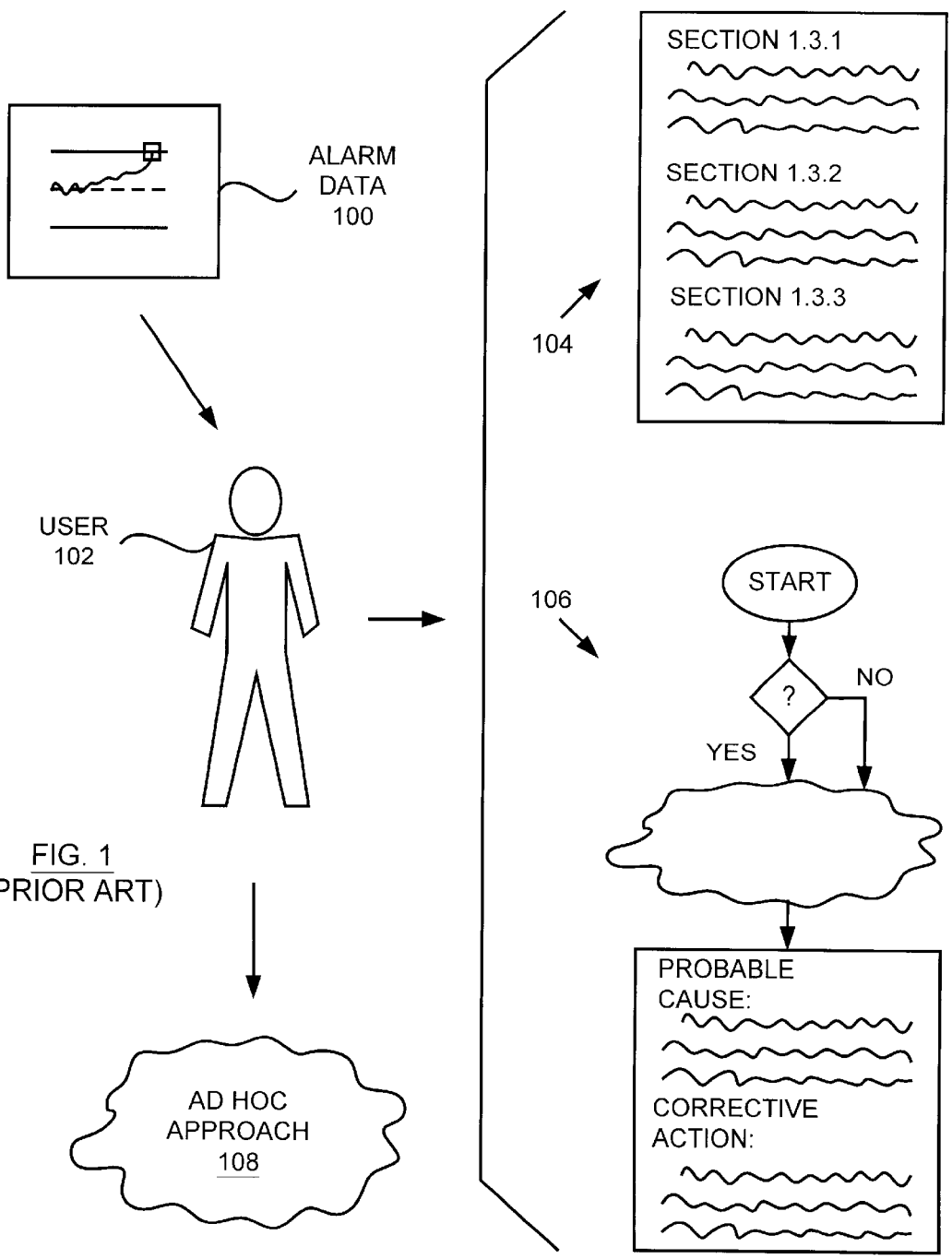
FIG. 1 is a diagram depicting a typical troubleshooting procedure initiated when a problem with a processing tool of a semiconductor wafer fabrication system is detected.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will, of course, be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 2:
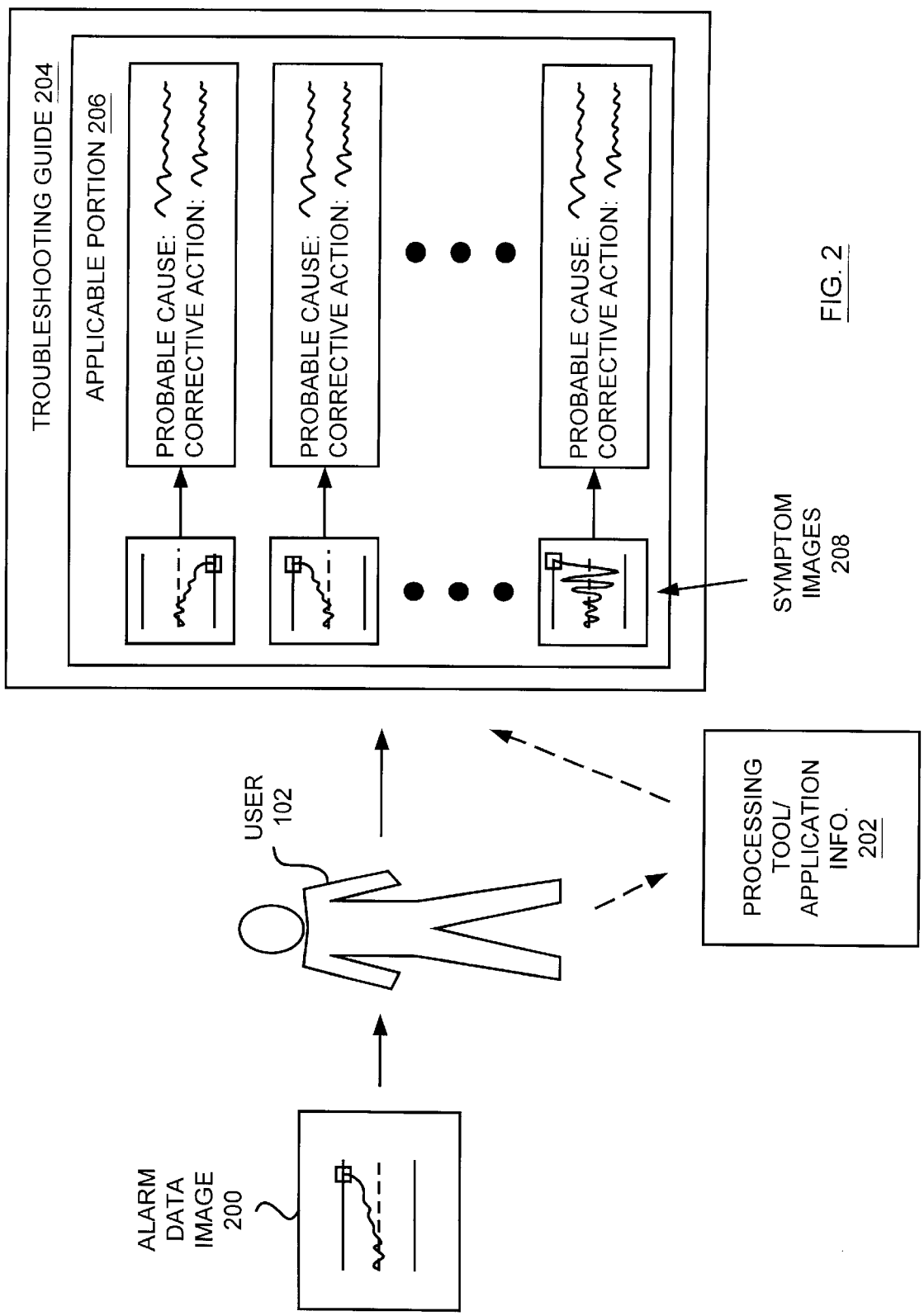
FIG. 2 is a diagram of one embodiment of a troubleshooting technique involving an alarm data image and multiple symptom images, wherein the alarm data image indicates an abnormal condition or faulty state (i.e., a problem), and wherein each of the symptom images indicates a symptom of the abnormal condition or faulty state (i.e., a symptom of the problem)

FIG. 2 is a diagram of one embodiment of a troubleshooting technique applicable to fabrication systems in general, and to semiconductor wafer fabrication systems in particular. The troubleshooting technique of FIG. 2 may be employed, for example, when a processing tool of a semiconductor wafer fabrication system is shut down due to a problem with the processing tool (e.g., an abnormal condition or alarm condition). In the troubleshooting technique of FIG. 2, user 102 (e.g., an operator or engineer) is provided with an "alarm data image" 200. An "alarm data image" is defined herein as any image which indicates an abnormal condition or faulty state (i.e., a problem). Alarm data image 200 may, for example, be generated using alarm data indicating the problem with the processing tool.

In the embodiment of FIG. 2, alarm data image 200 is a two-dimensional (2D) statistical process control (SPC) chart of SPC data regarding a measured characteristic of semiconductor wafers processed through the problematic processing tool, wherein the characteristic is affected by the processing tool. Alarm data image 200 indicates the measured characteristic exceeds an SPC upper control limit established for the processing tool. For example, the problematic processing tool may be a furnace as described above, and the characteristic may be a total number of particulate contaminants found upon surfaces of semiconductor wafers processed through the furnace. Exceeding an SPC upper control limit established for the furnace indicates that the total number of particulate contaminants found upon surfaces of semiconductor wafers processed through the furnace exceeds an upper limit of an acceptable range derived from historical performance of the furnace.

It is noted that, in other embodiments, alarm data image 200 may be, for example: (i) a three-dimensional (3D) chart or graph generated using data regarding a measured characteristic of semiconductor wafers processed through a given processing tool, wherein the characteristic is affected by the given processing tool, (ii) an image or picture of a condition existing on or within one or more semiconductor wafers processed through a given processing tool, or (iii) an image or picture of a physical condition of one or more components of a given processing tool.

In response to alarm data image 200, user 102 may provide processing tool/application information 202 as indicated in FIG. 2. Processing tool/application information 202 may include, for example, a type of the problematic processing tool and/or the application for which the problematic processing tool is being used. Processing tool/application information 202 may indicate, for example, a particular class in which the problem with the processing tool resides. Alternately, all of processing tool/application information 202 may be provided by one or more components of a semiconductor wafer fabrication system including the processing tool. Further still, the one or more components of the semiconductor wafer fabrication system may provide some of processing tool/application information 202, and user 102 may be required to provide a remainder of processing tool/application information 202.

Processing tool/application information 202 is used to access an applicable portion 206 of a troubleshooting guide (TSG) 204 as indicated in FIG. 2. Applicable portion 206 of TSG 204 is directed to the class in which the problem with the processing tool resides, and includes a set of "symptom images" 208. A "symptom image" is defined herein as any image which indicates a symptom of an abnormal condition or faulty state (i.e., a symptom of a problem). In the embodiment of FIG. 2, each of the symptom images 208 is a 2D SPC chart indicating a different way in which the measured characteristic of semiconductor wafers processed through the processing tool may depart the acceptable range established for the processing tool. In the embodiment of FIG. 2, symptom images 208 are provided to user 102 (e.g., displayed upon a display screen).

As indicated in FIG. 2, a probable cause/corrective action pair is associated with each of the symptom images 208 within TSG 204. A probable cause/corrective action pair associated with a given one of the symptom images 208 includes a probable cause for the problem and a corrective action which must be accomplished to solve the problem.

For example, TSG 204 may be a link-based "hypertext" (or "hypermedia") database in which objects, such as text and graphics, are "linked" to one another. When a displayed first object having a link to a second object is selected, the link is followed and the second object is displayed. The popular World Wide Web is a system of Internet servers that support documents formatted in the hypertext markup language (HTML), wherein HTML supports links between documents, graphics, audio, and video files. Within TSG 204, symptom images 208 may be linked to corresponding probable cause/corrective action pairs. When the symptom images 208 are displayed, and one of the symptom images 208 is selected, the link between the selected symptom image and the corresponding probable cause/corrective action pair may be followed, and the corresponding probable cause/corrective action pair may be displayed.

As will be described in more detail below, user 102 may select one of symptom images 208 which either: (i) most closely resembles (i.e., matches) alarm data image 200, or (ii) matches a physical condition of one or more components of the processing tool. When a given one of symptom images 208 is selected, the probable cause/corrective action pair corresponding to the given one of the symptom images 208 is provided to user 102 (e.g., displayed upon the display screen). User 102 may accomplish the corrective action of the probable cause/corrective action pair, or direct the accomplishment of the corrective action, in order to solve the problem (i.e., clear the alarm condition).

In some situations, symptom images 208 provided to user 102 may be the same type as alarm data image 200. For example, in FIG. 2, alarm data image 200 is a 2D SPC chart as described above, and symptom images 208 are all 2D SPC charts. Alarm data image 200 is a 2D SPC chart indicating the measured characteristic gradually drifts upward, finally exceeding the SPC upper control limit established for the processing tool. In the embodiment of FIG. 2, user 102 selects one of the symptom images 208 which most closely resembles (i.e., matches) alarm data image 200. Thus user 102 may select one of the symptom images 208 which indicates the measured characteristic gradually drifts upward, finally exceeding the SPC upper control limit established for the processing tool.

It is noted that, in other embodiments, one of the symptom images 208 may be automatically selected within the semiconductor wafer fabrication system. For example, where symptom images 208 are of the same type as alarm data image 200, the particular one of the symptom images 208 which most closely resembles (i.e., matches) alarm data image 200 may be automatically selected by one or more components of the semiconductor wafer fabrication system.

It is also noted that in other embodiments, alarm data image 200 and/or symptom images 208 may be, for example: (i) 3D charts or graphs generated using data regarding a measured characteristic of semiconductor wafers processed through a given processing tool, wherein the characteristic is affected by the given processing tool, (ii) images or pictures of conditions existing on or within one or more semiconductor wafers processed through a given processing tool, or (iii) images or pictures of physical conditions of one or more components of a given processing tool. For example, in situations where alarm data image 200 is an image or a picture of a condition existing on or within one or more semiconductor wafers processed through a particular processing tool, symptom images 208 may be images or pictures of physical conditions of one or more components of the particular processing tool.

Figure 3:
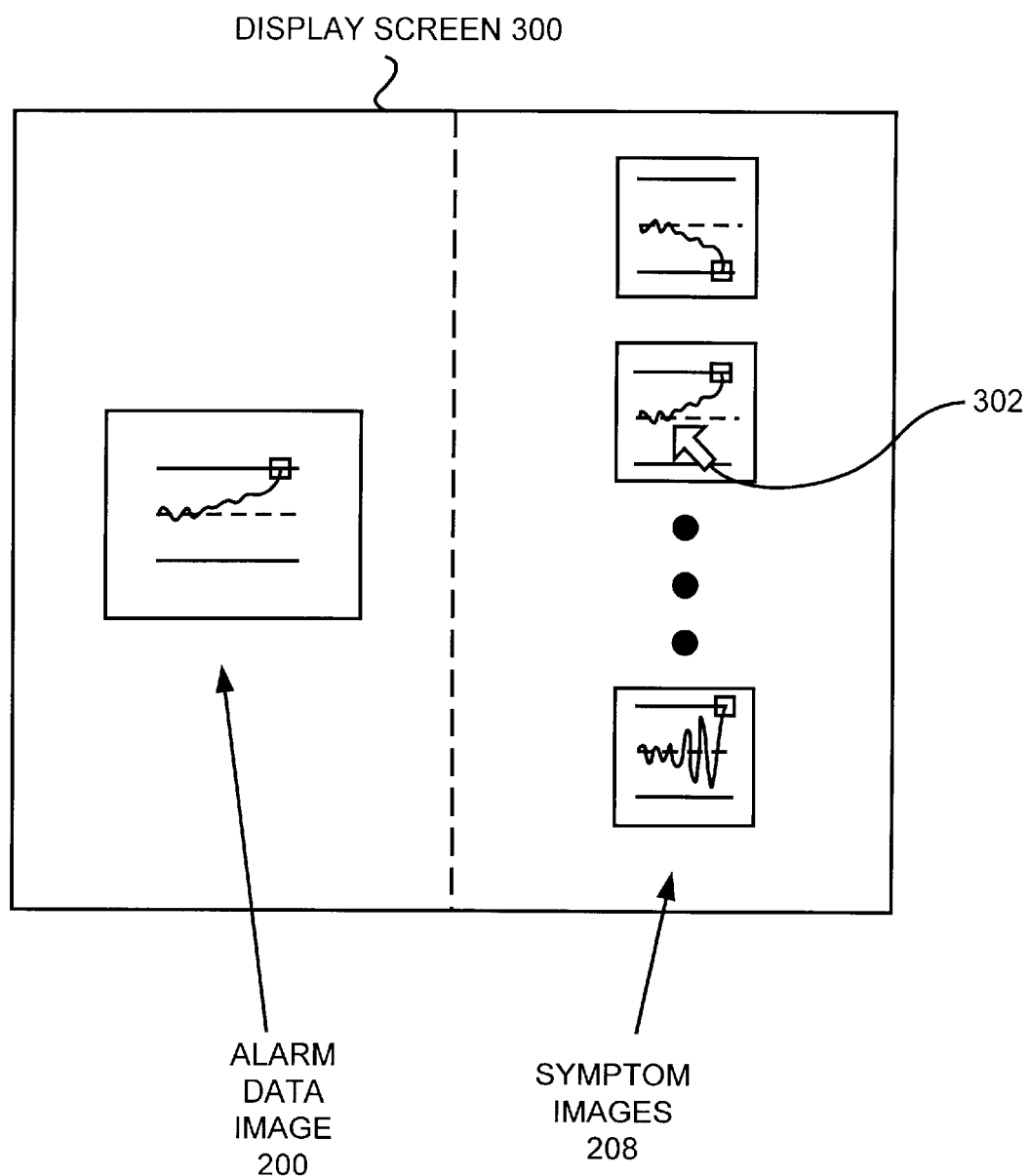
FIG. 3 is a diagram of a display screen illustrating how the alarm data image and the symptom images of FIG. 2 may be displayed upon the display screen in one embodiment.

FIG. 3 is a diagram of a display screen 300 illustrating how alarm data image 200 and symptom images 208 of FIG. 2 may be displayed upon display screen 300 in one embodiment. In the embodiment of FIG. 3, alarm data image 200 is displayed in a left-hand portion of display screen 300, and symptom images 208 are displayed in a right-hand portion of display screen 300. Although not essential, simultaneous display of alarm data image 200 and symptom images 208 upon display screen 300 is believed to facilitate image matching on the part of user 102. It may be beneficial to display only a portion of the symptom images 208 in the right-hand portion of display screen 300 at any given time. In this situation, different portions of symptom images 208 may be displayed in the right-hand portion of display screen 300 at different times such that all of symptom images 208 are eventually displayed in the right-hand portion of display screen 300.

In FIG. 3, an arrow 302 representing a positional state of a pointing device (e.g., a mouse) is shown over a particular one of the symptom images 208. User 102 may indicate selection of the particular one of the symptom images 208 by moving the pointing device such that arrow 302 is positioned over the particular one of the symptom images 208 as shown in FIG. 3, then activating an electrical switch (e.g., a button) of the pointing device, pressing a key of a keyboard, etc. When user 102 selects one of the symptom images 208, the probable cause/corrective action pair (FIG. 2) corresponding to the selected one of the symptom images 208 may be displayed upon display screen 300 (e.g., by following a link between the selected one of the symptom images 208 and the corresponding probable cause/corrective action pair as described above).

Figure 4:
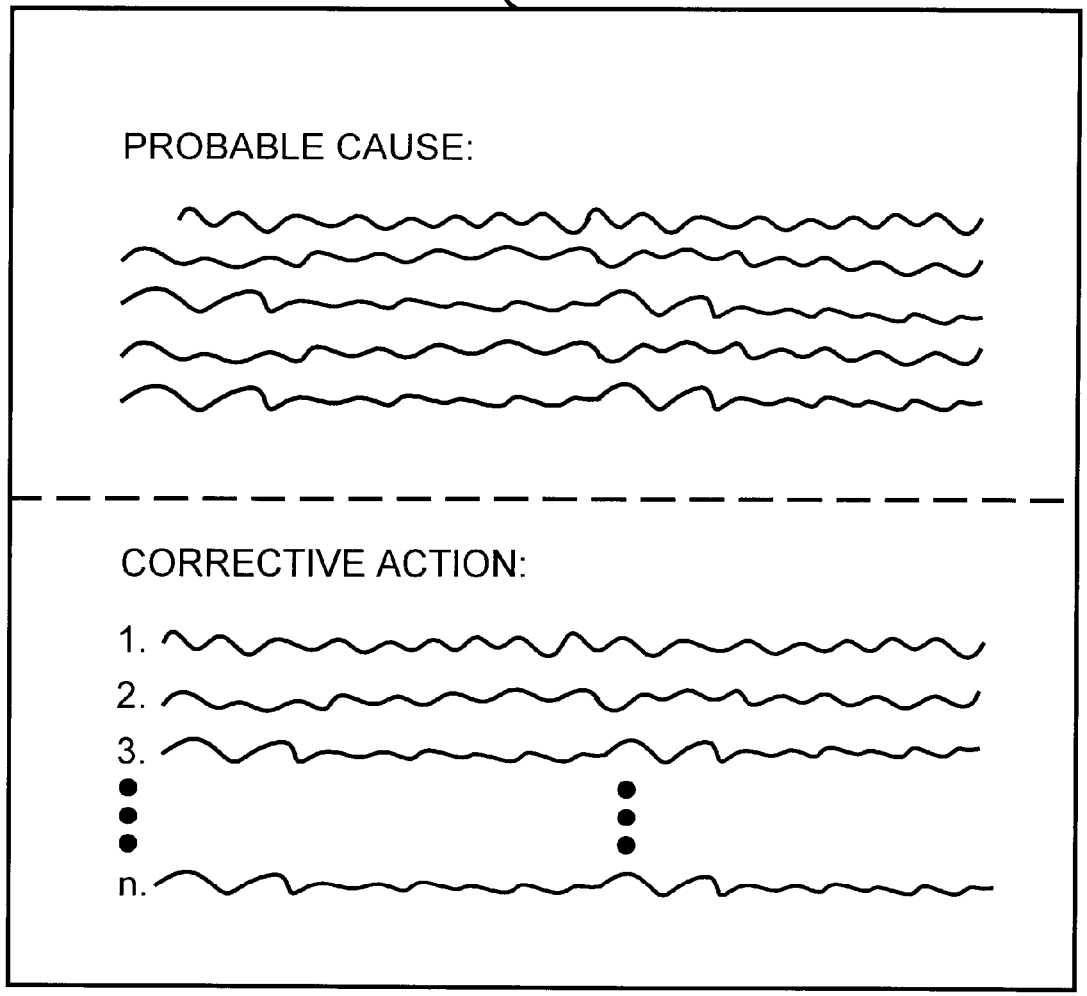
FIG. 4 is a diagram of the display screen of FIG. 3 illustrating one embodiment of how a probable cause/corrective action pair corresponding to a selected one of the symptom images may be displayed upon the display screen.

FIG. 4 is a diagram of display screen 300 of FIG. 3 illustrating one embodiment of how the probable cause/corrective action pair (FIG. 2) corresponding to the selected one of the symptom images 208 may be displayed upon display screen 300 (e.g., following user selection). In the embodiment of FIG. 4, the probable cause of the probable cause/corrective action pair is displayed in an upper portion of display screen 300, and the corrective action of the probable cause/corrective action pair is displayed in a lower portion of display screen 300. In the embodiment of FIG. 4, the corrective action of the probable cause/corrective action pair includes multiple required activities numbered I through n. In some situations, the n required activities may need to be accomplished in numerical sequence to solve the problem. In general, a corrective action may include one or more required activities which must be accomplished (e.g., by user 102) to solve the problem (i.e., clear the alarm condition), and the required activities may or may not need to be accomplished in a certain order to solve the problem.

One or more required activities of a corrective action may involve the problematic processing tool. In this situation, the one or more required activities may be optionally carried out automatically by one or more components of the semiconductor wafer fabrication system when selected by user 102. For example, a required activity involving the problematic processing tool may be highlighted in some way to alert user 102 that optional automatic accomplishment of the required activity is available. For example, text conveying the required activity may be displayed in a different color, displayed in a different font, displayed in bold letters, italicized, underlined, or any combination of the above. User 102 may select the highlighted required activity for automatic accomplishment by, for example, moving the pointing device such that arrow 302 is positioned over the highlighted required activity, then activating an electrical switch (e.g., a button) of the pointing device, pressing a key of the keyboard, etc. Automatic accomplishment of required activities will be described in more detail below.

Figure 5:
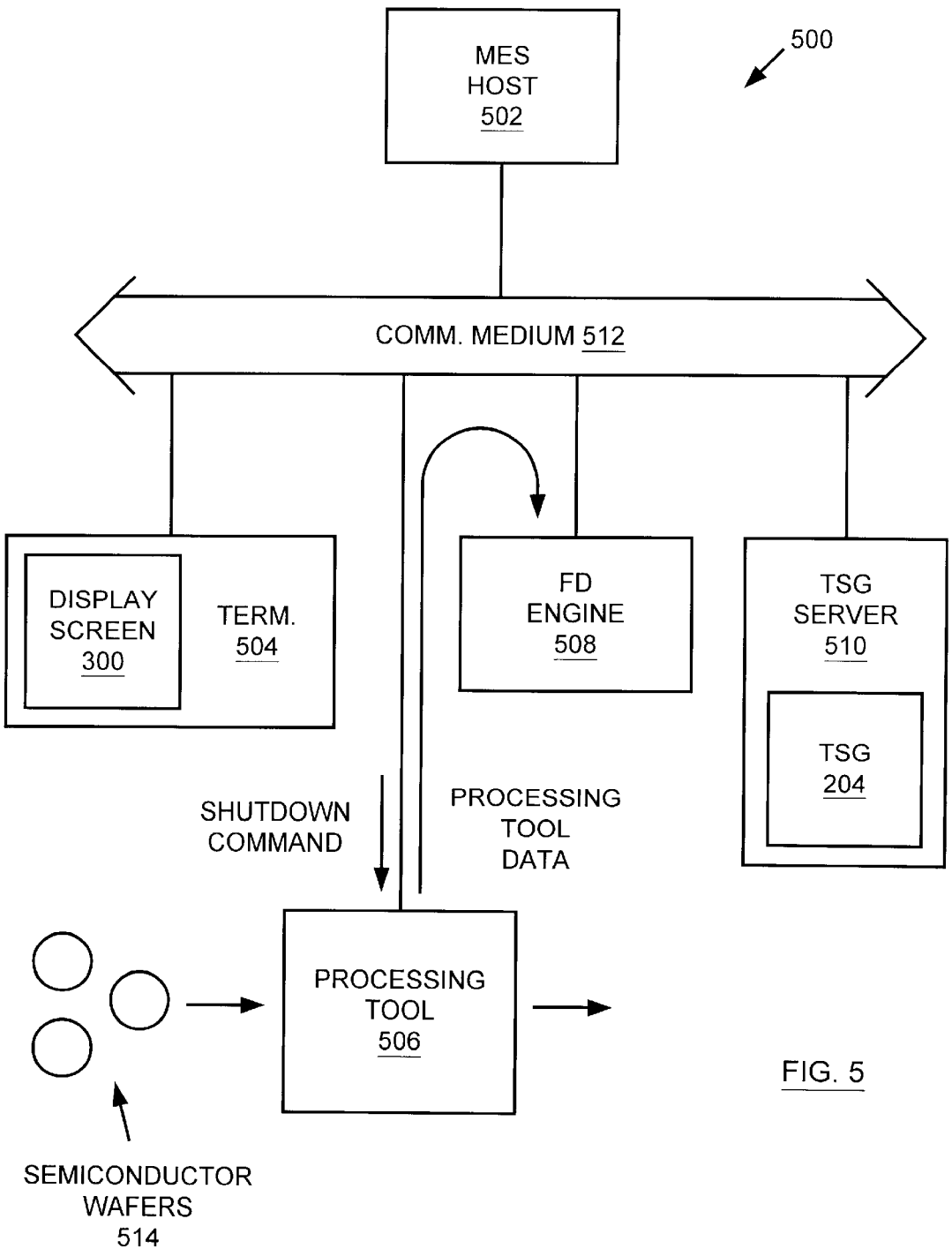
FIG. 5 is a diagram of one embodiment of a first semiconductor wafer fabrication system embodying the troubleshooting technique of FIG. 2.

FIG. 5 is a diagram of one embodiment of a semiconductor wafer fabrication system 500 embodying the troubleshooting technique of FIG. 2. Semiconductor wafer fabrication system 500 includes a manufacturing execution system (MES) host 502, a terminal 504, a processing tool 506, a fault detection (FD) engine 508, and a troubleshooting guide (TSG) server 510, all coupled to a communication medium 512 (e.g., a bus). Processing tool 506 may be, for example, a deposition tool for depositing a layer of a desired material upon surfaces of semiconductor wafers 514, a photolithography tool for patterning layers of photoresist material, an etch tool for patterning layers of desired materials formed upon surfaces of semiconductor wafers 514, an implant tool for positioning dopant atoms upon and/or within surfaces of semiconductor wafers 514, or a furnace for heating semiconductor wafers 514. It is noted that semiconductor wafer fabrication system 500 most likely includes other processing tools in addition to processing tool 506.

MES host 502 performs many tasks, including scheduling of semiconductor wafers 514 for processing through processing tool 506, downloading processing instructions (e.g., processing recipes) to processing tool 506 via communication medium 512, and tracking the locations of semiconductor wafers 514 during processing within semiconductor wafer fabrication system 500.

During processing of semiconductor wafers 514 through processing tool 506, processing tool 506 provides processing tool data to FD engine 508 as indicted in FIG. 5. FD engine 508 uses the processing tool data to determine if processing tool 506 is operating in a "normal" state or a "faulty" state. It is noted that processing tool 506 operates in the faulty state when there is a problem with processing tool 506. In the embodiment of FIG. 5, if the processing tool data indicates processing tool 506 is operating in the faulty state, FD engine 508 provides an alarm signal to MES host 502, and alarm data to terminal 504. In response to the alarm signal, MES host 502 may issue a shutdown command to processing tool 506. Alternately, FD engine 508 may issue the shutdown command to processing tool 506.

The alarm data provided to terminal 504 may, for example, convey alarm data image 200 (FIGS. 2–3). Alternately, terminal 504 may use the alarm data to generate alarm data image 200. In the embodiment of FIG. 5, terminal 504 includes display screen 300 (FIGS. 3–4), and displays alarm data image 200 upon display screen 300.

As described above, user 102 (FIGS. 1–2) may provide some or all of processing tool/application information 202 (FIG. 2) to TSG server 510 (e.g., via an input device of terminal 504). Alternately, processing tool 506 and/or FD engine 508 may provide processing tool/application information 202 to TSG server 510. As described above, processing tool/application information 202 may indicate a class in which the problem with processing tool 506 resides. As indicated in FIG. 5, TSG server 510 includes TSG 204 (FIG. 2). In response to the received processing tool/application information 202, TSG server 510 accesses applicable portion 206 (FIG. 2) of TSG 204.

As shown in FIG. 2 and described above, applicable portion 206 of TSG 204 includes symptom images 208 and corresponding probable cause/corrective action pairs. After using the received processing tool/application information 202 to access applicable portion 206 of TSG 204, TS6 server 510 provides TSG data to terminal 504, where the TSG data conveys symptom images 208 of applicable portion 206 of TSG 204. Terminal 504 may display alarm data image 200 and symptom images 208 in different portions of display screen 300 simultaneously as shown in FIG. 3. Alternately, terminal 504 may display alarm data image 200 in one portion of display screen 300, and may display symptom images 208 sequentially in another portion of display screen 300.

As described above, user 102 may select one of the symptom images 208 (e.g., one of the symptom images 208 most closely resembling alarm data image 200). User 102 may indicate selection of one of the symptom images 208 using a pointing device as described above. When user 102 selects one of the symptom images 208, terminal 504 may provide selection data to TSG server 510 indicating the selected one of the symptom images 208. In response to the selection data, TSG server 510 may provide probable cause/corrective action data to terminal 504, wherein the probable cause/corrective action data conveys the probable cause/corrective action pair corresponding to the selected one of the symptom images 208. Terminal 504 may display the probable cause/corrective action pair upon display screen 300 as shown in FIG. 4. User 102 may then solve the problem (i.e., clear the alarm condition) by accomplishing, or directing the accomplishment of, the corrective action of the probable cause/corrective action pair.

It is noted that should the alarm condition be caused by a problem not documented in TSG 204, applicable portion 206 of TSG 204 may not exist, and symptom images 208 may not be available. In this situation, user 102 may be asked to solve the problem using an ad hoc approach (e.g., ad hoc approach 108 shown in FIG. I and described above), and to update TSG 204 after solving the problem. Such updating of TSG 204 may involve the addition of applicable portion 206 to TSG 204, including one or more symptom images 208 and corresponding probable cause/corrective action pairs.

Automatic accomplishment of required activities involving processing tool 506 will now be described. As described above with respect to FIG. 4, a corrective action includes one or more required activities. User 102 may select a highlighted required activity displayed upon display screen 300 of terminal 504 for automatic accomplishment (e.g., via a pointing device such as a mouse). Referring to FIGS. 4 and 5 in combination, when user 102 selects a particular highlighted required activity for automatic accomplishment, terminal 504 may send selection data to TSG server 510 indicating user selection of the particular required activity for automatic accomplishment. In response to the selection data, TSG server 510 may send a signal to MES host 502, and MES host 502 may respond to the signal by providing one or more control signals to processing tool 506. In responding to the control signals, processing tool 506 may accomplish the selected required activity.

For example, processing tool 506 may include a processing chamber. During processing of semiconductor wafers 514 through processing tool 506, semiconductor wafers 514 may be positioned within the chamber, and a gas within the chamber (e.g., air) may be evacuated from the chamber. Regarding a problem where a total number of particulate contaminants upon surfaces of semiconductor wafers processed through processing tool 506 exceeds an SPC upper control limit established for processing tool 506, the corrective action may include the required activity "PUMP/VENT THE CHAMBER." Such a "pump/vent" activity may involve evacuating the chamber, then opening a valve which allows a gas (e.g., filtered air) to enter the chamber. The pump/vent of the chamber creates turbulence in the chamber which may dislodge particulates clinging to interior surfaces of the chamber. During a subsequent evacuation of the chamber, the particles may be expelled from the chamber along with a gas (e.g., air) in the chamber. As a result, a number of particulates clinging to interior surfaces of the chamber may be reduced, expectedly reducing the total number of particulate contaminants upon surfaces of semiconductor wafers 514 when processed through processing tool 506.

When displayed upon display screen 300 of terminal 504, the letters of the phrase "PUMP/VENT THE CHAMBER" may be highlighted as described above indicating the "PUMP/VENT THE CHAMBER" required activity may be optionally accomplished automatically. Following user 102 selection of the "PUMP/VENT THE CHAMBER" required activity for automatic accomplishment (e.g., via the pointing device), terminal 504 may send selection data to TSG server 510 indicating user selection of the "PUMP/VENT THE CHAMBER" activity for automatic accomplishment. In response to the selection data, TSG server 510 forwards a signal to MES host 502. MES host 502 may respond to the signal by providing control signals to processing tool 506 which cause processing tool 506 to evacuate a gas (e.g., air) from the chamber, then open the valve which allows a gas (e.g., filtered air) to enter the chamber. In responding to the control signals, processing tool 506 accomplishes the selected "PUMP/VENT THE CHAMBER" required activity.

It is noted that, in other embodiments, TSG server 510 may respond to selection data from terminal 504 indicating user selection of a particular required activity for automatic accomplishment by sending one or more control signals to processing tool 506. In responding to the control signals, processing tool 506 may accomplish the selected required activity.

Figure 6:
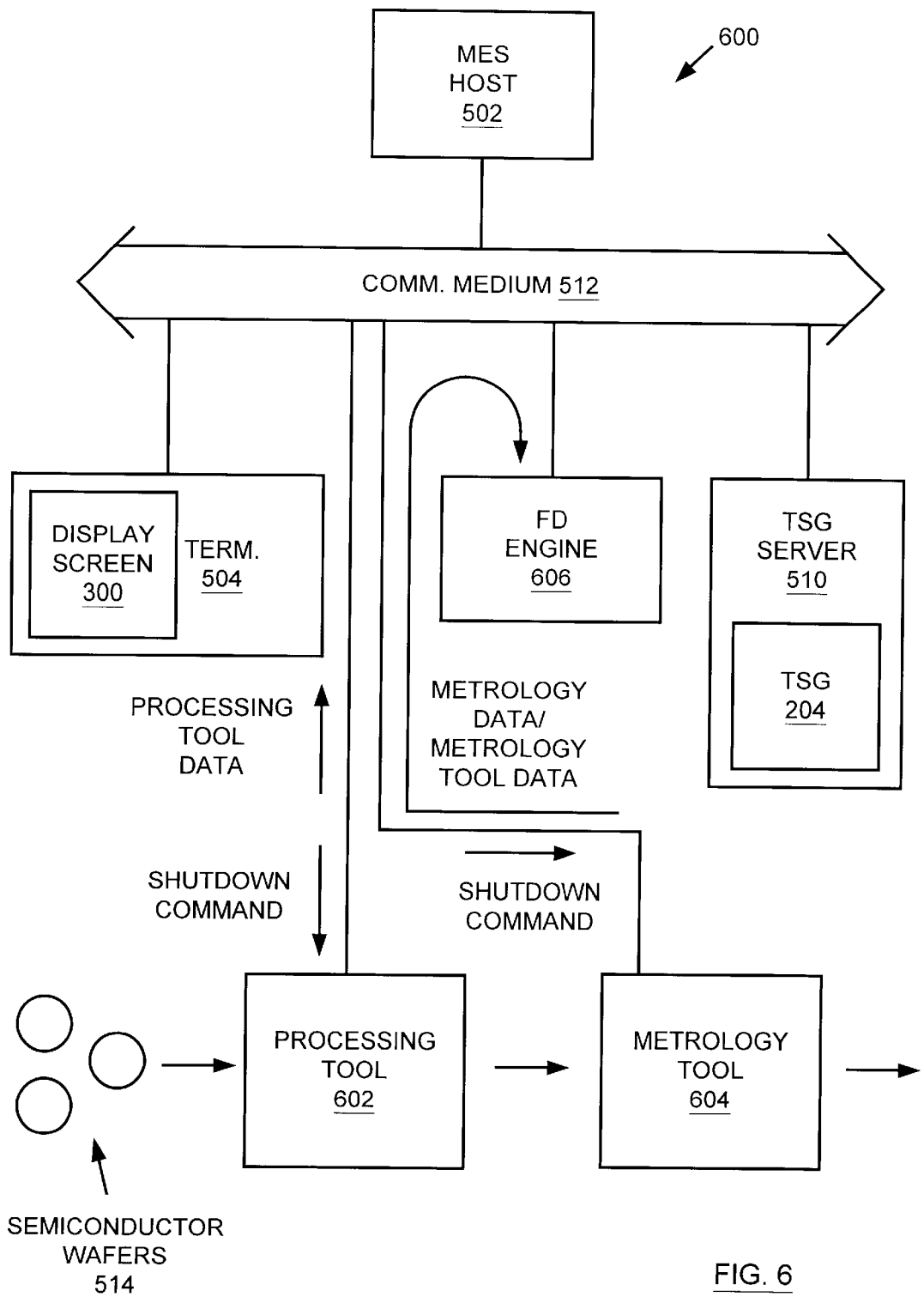
FIG. 6 is a diagram of one embodiment of a second semiconductor wafer fabrication system embodying the troubleshooting technique of FIG. 2.

FIG. 6 is a diagram of an embodiment of a semiconductor wafer fabrication system 600 embodying the troubleshooting technique of FIG. 2. Components of semiconductor wafer fabrication system 600 shown in FIG. 5 and described above are labeled similarly in FIG. 6. Semiconductor wafer fabrication system 600 includes MES host 502, terminal 504, a processing tool 602, a metrology tool 604, a fault detection (FD) engine 606, and TSG server 510, all coupled to communication medium 512. Processing tool 602 may be, for example, a deposition tool for depositing a layer of a desired material upon surfaces of semiconductor wafers 514, a photolithography tool for patterning layers of photoresist material, an etch tool for patterning layers of desired materials formed upon surfaces of semiconductor wafers 514, an implant tool for positioning dopant atoms upon and/or within surfaces of semiconductor wafers 514, or a furnace for heating semiconductor wafers 514. It is noted that semiconductor wafer fabrication system 600 most likely includes other processing tools in addition to processing tool 602. Metrology tool 604 is used to measure one or more characteristics of semiconductor wafers 514 after semiconductor wafers 514 have been processed through processing tool 602, wherein the processing of semiconductor wafers 514 through processing tool 602 affects the one or more characteristics.

During processing of semiconductor wafers 514 through processing tool 602, processing tool 602 may or may not provide processing tool data to FD engine 606 as described above with respect to processing tool 506 of FIG. 5. Where processing tool 602 provides processing tool data to FD engine 606, FD engine 606 may use the processing tool data to determine if processing tool 602 is operating in the normal state or the faulty state as described above. If the processing tool data indicates processing tool 602 is operating in the faulty state, FD engine 606 may provide an alarm signal to MES host 502, and alarm data to terminal 504. In response to the alarm signal, MES host 502 may issue a shutdown command to processing tool 602. Alternately, FD engine 606 may issue the shutdown command to processing tool 602.

Following processing of semiconductor wafers 514 through processing tool 602, semiconductor wafers 514 are processed through metrology tool 604. As described above, metrology tool 604 is used to measure one or more characteristics of semiconductor wafers 514 affected by processing through processing tool 602 (e.g., numbers of particulate contaminants on surfaces of semiconductor wafers 514, thicknesses of formed layers, electrical properties of formed structures, etc.). Metrology tool 604 provides metrology data regarding the measured characteristics to FD engine 606 as indicated in FIG. 6. The metrology data indicates whether processing tool 602 is operating in the normal state or the faulty state. If the metrology data indicates processing tool 602 is operating in the faulty state, FD engine 606 provides the alarm signal to MES host 502, and alarm data to terminal 504. In response to the alarm signal, MES host 502 may issue the shutdown command to processing tool 602. Alternately, FD engine 606 may issue the shutdown command to processing tool 602.

During the processing of semiconductor wafers 514 through metrology tool 604, metrology tool 604 may provide metrology tool data to FD engine 606 in addition to the metrology data as indicated in FIG. 6. FD engine 606 may use the metrology tool data to determine if metrology tool 604 is operating in a "normal" state or a "faulty" state. It is noted that metrology tool 604 operates in the faulty state when there is a problem with metrology tool 604. If the metrology tool data indicates metrology tool 604 is operating in the faulty state, FD engine 606 may provide an alarm signal to MES host 502, and alarm data to terminal 504. In response to the alarm signal, MES host 502 may issue a shutdown command to metrology tool 604. Alternately, FD engine 606 may issue the shutdown command to metrology tool 604.

Information about the problematic processing or metrology tool and/or the application for which the problematic tool is being used (i.e., tool/application information) may be provided to TSG server 510. Where the problematic tool is processing tool 602, user 102 may provide some or all of processing tool/application information 202 (FIG. 2) regarding processing tool 602 to TSG server 510 (e.g., via an input device of terminal 504). Processing tool 602 and/or FD engine 606 may also provide some or all of processing tool/application information 202 to TSG server 510. Where the problematic tool is metrology tool 604, user 102 may provide some or all of metrology tool/application information regarding metrology tool 604 to TSG server 510 (e.g., via an input device of terminal 504). Metrology tool 604 and/or FD engine 606 may also provide some or all of the metrology tool/application information to TSG server 510. As shown in FIG. 6 and described above, TSG server 510 includes TSG 204 (FIG. 2). In response to the received tool/application information, TSG server 510 accesses applicable portion 206 (FIG. 2) of TSG 204 as described above.

As described above, applicable portion 206 of TSG 204 includes symptom images 208 and corresponding probable cause/corrective action pairs. After using the received tool/application information to access applicable portion 206 of TSG 204, TSG server 510 provides TSG data to terminal 504, where the TSG data conveys symptom images 208 of applicable portion 206 of TSG 204. Terminal 504 may display alarm data image 200 and symptom images 208 in different portions of display screen 300 simultaneously as shown in FIG. 3. Alternately, terminal 504 may display alarm data image 200 in one portion of display screen 300, and may display symptom images 208 sequentially in another portion of display screen 300.

As described above, user 102 may select one of the symptom images 208 (e.g., one of the symptom images 208 most closely resembling alarm data image 200). User 102 may indicate selection of a particular one of the symptom images using a pointing device as described above. When user 102 selects a particular one of the symptom images 208, terminal 504 may provide selection data to TSG server 510 indicating the selected one of the symptom images 208. In response to the selection data, TSG server 510 may provide probable cause/corrective action data to terminal 504, wherein the probable cause/corrective action data conveys the probable cause/corrective action pair corresponding to the selected one of the symptom images 208. Terminal 504 may display the probable cause/corrective action pair upon display screen 300 as shown in FIG. 4. User 102 may then solve the problem (i.e., clear the alarm condition) by accomplishing, or directing the accomplishment of, the corrective action of the probable cause/corrective action pair.

Figure 7:
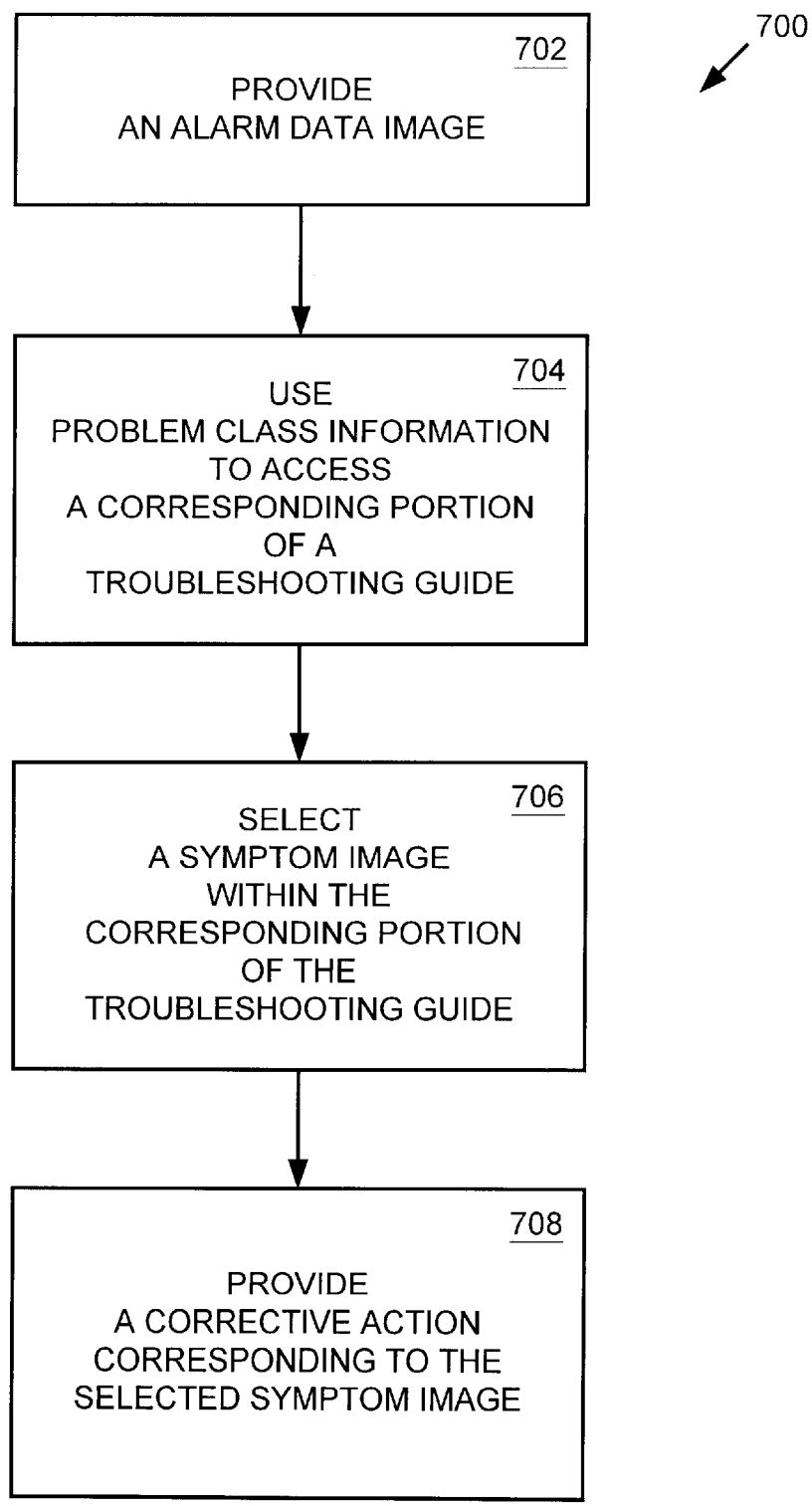
FIG. 7 is a flow chart of a troubleshooting method encompassing the troubleshooting technique of FIG. 2.

FIG. 7 is a flow chart of a troubleshooting method 700 encompassing the troubleshooting technique of FIG. 2. During a step 702 of method 700, an alarm data image is provided (e.g., to a user). As described above, the alarm data image is an image indicating a problem (e.g., an abnormal condition or faulty state of a processing or metrology tool of a fabrication system). The alarm data image may be generated by one or more components of a fabrication system. For example, a fault detection component of a fabrication system may generate alarm data when an abnormal condition or faulty state of a processing or metrology tool is detected, and may provide the alarm data to a terminal. The alarm data may convey the alarm data image. Alternately, the terminal may use the alarm data to generate the alarm data image. The terminal may provide the alarm data image to the user by displaying the alarm data image upon a display screen of the terminal.

During a step 704, problem class information is used to access a corresponding portion of a troubleshooting guide (i.e., applicable portion 206 of troubleshooting guide 204 as shown in FIG. 2 and described above). The problem class information indicates a class in which the problem resides. As described above, problem class information may include a type of a problematic processing or metrology tool and/or a particular application of the problematic tool. The corresponding portion of the troubleshooting guide includes at least one symptom image. Each symptom image is an image indicating a symptom of the class in which the problem resides, and has a corresponding corrective action in the troubleshooting guide.

One of the symptom images within the corresponding portion of the troubleshooting guide is selected during a step 706. As described above, one of the symptom images may be selected by the user (e.g., using a pointing device), or automatically by one or more components of a fabrication system (e.g., using an image matching technique). In some situations, the selection process may involve selecting one of symptom images which most closely resembles (i.e., matches) the alarm data image. In other situations, the alarm data image may be, for example, an image or a picture of a condition existing on or within one or more work pieces (e.g., semiconductor wafers) processed through the problematic tool, and the selection process may involve selecting one of the symptom images which depicts a physical condition of one or more components of the problematic tool.

During a step 708, the corrective action corresponding to the selected symptom image is provided (e.g., to the user).

As described above, the problem may be solved by accomplishing the corrective action.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A troubleshooting method, comprising:
    providing an alarm data image, wherein the alarm data image comprises an image indicative of a problem;
    using information indicative of a class in which the problem resides to access a corresponding portion of a troubleshooting guide (TSG), wherein the corresponding portion of the TSG comprises at least one symptom image, and wherein each of the at least one symptom image comprises an image indicative of a symptom of the class in which the problem resides, and wherein each of the at least one symptom image has a corresponding corrective action;
    selecting a selected one of the at least one symptom image; and
    providing the corrective action corresponding to the selected one of the at least one symptom image.

2. The troubleshooting method as recited in claim 1, wherein the problem represents an abnormal condition.

3. The troubleshooting method as recited in claim 1, wherein providing of the alarm data image comprises:
    receiving alarm data indicative of a problem; using the alarm data to generate an alarm data image, wherein the alarm data image comprises an image indicative of the problem; and
    providing the alarm data image.

4. The troubleshooting method as recited in claim 1, wherein providing of the alarm data image comprises:
    displaying an alarm data image upon a display screen, wherein the alarm data image comprises an image indicative of a problem.

5. The troubleshooting method as recited in claim 1, wherein selecting of the selected one of the at least one symptom image comprises:
    selecting a selected one of the at least one symptom image by a user.

6. The troubleshooting method as recited in claim 1, wherein selecting of the selected one of the at least one symptom image comprises:
    selecting a selected one of the at least one symptom image, wherein the selected one of the at least one symptom image most closely resembles the alarm data image.

7. The troubleshooting method as recited in claim 1, wherein selecting of the selected one of the at least one symptom image comprises:
    providing the at least one symptom image; and
    receiving data indicative of a selected one of the at least one symptom image.

8. The troubleshooting method as recited in claim 1, wherein providing of the alarm data image comprises:
    providing a two-dimensional (2D) statistical process control (SPC) chart of data regarding a measured characteristic of at least one semiconductor wafer processed through a processing tool versus time, wherein the measured characteristic is affected by the processing tool, and wherein the 2D SPC chart indicates the measured characteristic has departed an acceptable range established for the processing tool.

9. The troubleshooting method as recited in claim 8, wherein selecting of the selected one of the at least one symptom image comprises:
    selecting a selected one of the at least one symptom image, wherein each of the at least one symptom image is a 2D SPC chart of data regarding the measured characteristic of the at least one semiconductor wafer processed through the processing tool versus time, and wherein each of the at least one symptom image indicates a different way in which the measured characteristic may depart the acceptable range established for the processing tool, and wherein the selected one of the at least one symptom image most closely resembles the alarm data image.

10. The troubleshooting method as recited in claim 1, wherein providing of the alarm data image comprises:
    providing an alarm data image, wherein the alarm data image comprises an image indicative of a problem, and wherein the alarm data image is selected from the group consisting of: (i) a two-dimensional (2D) chart or graph, (ii) a three-dimensional (3D) chart or graph, and (iii) an image or picture.

11. The troubleshooting method as recited in claim 10, wherein selecting of the selected one of the at least one symptom image comprises:
    selecting a selected one of the at least one symptom image, wherein when the alarm data image is a 2D chart or graph, each of the at least one symptom image is a 2D chart or graph, and wherein when the alarm data image is a 3D chart or graph, each of the at least one symptom image is a 3D chart or graph, and wherein when the alarm data image is an image or picture, each of the at least one symptom image is an image or picture.

12. The troubleshooting method as recited in claim 1, wherein providing of the alarm data image comprises:
    providing an alarm data image, wherein the alarm data image comprises an image indicating a measured characteristic of at least one semiconductor wafer processed through a processing tool has departed an acceptable range established for the processing tool, and wherein the alarm data image is selected from the group consisting of: (i) a two-dimensional (2D) chart or graph generated using historical data regarding the measured characteristic, (ii) a three-dimensional (3D) chart or graph generated using historical data regarding the measured characteristic, and (iii) an image or picture of a condition existing on or within the at least one semiconductor wafer.

13. The troubleshooting method as recited in claim 12, wherein selecting of the selected one of the at least one symptom image comprises:
    selecting a selected one of the at least one symptom image, wherein each of the at least one symptom image comprises an image indicating a different way in which the measured characteristic of the at least one semiconductor wafer processed through the processing tool may depart the acceptable range established for the processing tool, and wherein when the alarm data image is a 2D chart or graph, each of the at least one symptom image is a 2D chart or graph, and wherein when the alarm data image is a 3D chart or graph, each of the at least one symptom image is a 3D chart or graph, and wherein when the alarm data image is an image or picture of a condition existing on or within at least one of the semiconductor wafers, each of the at least one symptom image is an image or picture of a physical condition of at least one component of the processing tool.

14. The troubleshooting method as recited in claim 1, wherein the information indicative of the class in which the problem resides comprises a type of a processing tool.

15. The troubleshooting method as recited in claim 14, wherein the information indicative of the class in which the problem resides further comprises an application for which the processing tool is being used.

16. The troubleshooting method as recited in claim 1, further comprising:
providing information indicative of a class in which the problem resides by a user.

17. The troubleshooting method as recited in claim 1, further comprising accomplishing the corrective action to solve the problem.

18. A troubleshooting method, comprising:
displaying an alarm data image upon a display screen, wherein the alarm data image comprises an image indicative of a problem;
using information indicative of a class in which the problem resides to access a portion of a troubleshooting guide (TSG), wherein the portion of the TSG comprises at least one symptom image, and wherein each of the at least one symptom image comprises an image indicative of a symptom of the class in which the problem resides, and wherein each of the at least one symptom image has a corresponding probable cause and corrective action;
displaying the at least one symptom image upon the display screen;
selecting a selected one of the at least one symptom image by a user;
displaying the probable cause and the corrective action corresponding to the selected one of the at least one symptom image upon the display screen; and
accomplishing the corrective action to solve the problem.

19. The troubleshooting method as recited in claim 18, wherein displaying of the alarm data image upon the display screen comprises:
displaying an alarm data image within a first portion of a display screen, wherein the alarm data image comprises an image indicative of a problem.

20. The troubleshooting method as recited in claim 19, wherein displaying of the at least one symptom image upon the display screen comprises:
displaying the at least one symptom image within a second portion of the display screen such that the alarm data image and the at least one symptom image are displayed upon the display screen simultaneously.

21. The troubleshooting method as recited in claim 18, wherein selecting the selected one of the at least one symptom image by the user comprises:
moving a pointing device by the user until an arrow displayed upon the display screen and representing a positional state of the pointing device is displayed over a selected one of the at least one symptom image; and
selecting the selected one of the at least one symptom image by the user activating an electrical switch.

22. The troubleshooting method as recited in claim 18, wherein displaying of the probable cause and the corrective action comprises:
displaying the probable cause corresponding to the selected one of the at least one symptom image within a first portion of the display screen; and
displaying the corrective action corresponding to the selected one of the at least one symptom image within a second portion of the display screen such that the probable cause and the corrective action are displayed upon the display screen simultaneously.

* * * * *